United States Patent
Tu et al.

(10) Patent No.: US 8,493,055 B2
(45) Date of Patent: Jul. 23, 2013

(54) VOLTAGE MEASUREMENT APPARATUS

(75) Inventors: Yi-Xin Tu, Shenzhen (CN); Hai-Qing Zhou, Shenzhen (CN); Jin-Liang Xiong, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 204 days.

(21) Appl. No.: 13/104,018

(22) Filed: May 10, 2011

(65) Prior Publication Data

US 2012/0262148 A1 Oct. 18, 2012

(30) Foreign Application Priority Data

Apr. 15, 2011 (CN) .......................... 2011 1 0095115

(51) Int. Cl.
*G01R 19/00* (2006.01)
(52) U.S. Cl.
USPC ...................................................... 324/76.11

(58) Field of Classification Search
USPC .... 324/764.01, 762.01–762.1, 750.01–750.3, 324/76.11; 361/90, 91.5
See application file for complete search history.

(56) References Cited

U.S. PATENT DOCUMENTS 8,089,264 B2 * 1/2012 Huang ....................... 324/76.11

* cited by examiner

*Primary Examiner* — Tung X Nguyen
(74) *Attorney, Agent, or Firm* — Altis Law Group, Inc.

(57) ABSTRACT

A voltage measurement apparatus includes a power interface, first and second voltage detecting modules, first and second driving modules, and first and second indication modules. The first voltage detecting module compares an output voltage with a first reference voltage, to determine whether the output voltage is greater than the first reference voltage. The second voltage detecting module compares the output voltage with a second reference voltage, to determine whether the output voltage is less than the second reference voltage. The first indication module indicates the output voltage when the output voltage is greater than the upper limit voltage or less than the lower limit voltage. The second indication module indicates the output voltage when the output voltage is less than or equal to the upper limit voltage and greater than or equal to the lower limit voltage.

9 Claims, 2 Drawing Sheets

VOLTAGE MEASUREMENT APPARATUS

BACKGROUND

1. Technical Field

The present disclosure relates to a voltage measurement apparatus.

2. Description of Related Art

A power supply of a computer outputs different voltages, such as +12 volts (V), +5V, and +3.3V. These output voltages of the power supply usually need to be precisely measured before they are outputted to, for example, a motherboard of the computer. However, measurement devices are expensive, and are complex in design.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of examples and not by limitation. It should be noted that references to "an" or "one" embodiment in this disclosure are not necessarily to the same embodiment, and such references mean at least one.

Figure 1:
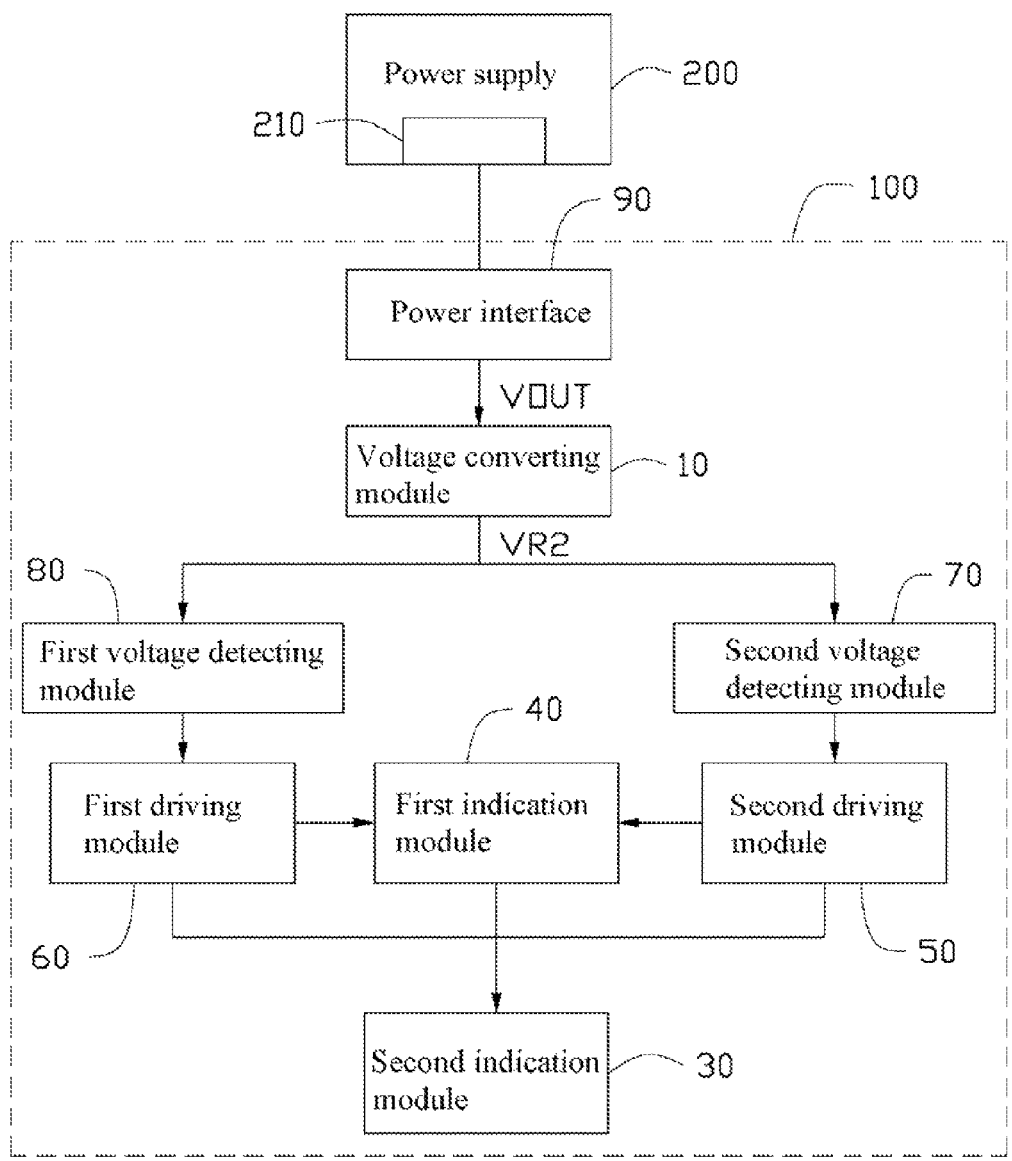
FIG. 1 is a block diagram of a voltage measurement apparatus in accordance with an exemplary embodiment of the present disclosure, the voltage measurement apparatus is connected to a power supply.

Referring to FIG. 1, a voltage measurement apparatus 100 is configured to measure an output voltage VOUT from a power supply 200. The voltage measurement apparatus 100 in accordance with an exemplary embodiment includes a power interface 90 connected to a power interface 210 of the power supply 200, a voltage converting module 10, a first voltage detecting module 80, a second voltage detecting module 70, a first driving module 60, a second driving module 50, a first indication module 40, and a second indication module 30. In one embodiment, when a work voltage from the power supply 200 ranges between an upper limit and a lower limit, it can be output to a motherboard.

The voltage converting module 10 converts the output voltage VOUT from the power supply 200 to an intermediate voltage VR2 and outputs the intermediate voltage VR2 to the first voltage detecting module 80 and the second voltage detecting module 70.

The first voltage detecting module 80 compares the intermediate voltage VR2 with a first reference voltage, to determine whether the intermediate voltage VR2 is greater than the first reference voltage, and to further determine whether the output voltage VOUT is greater than the upper limit of the work voltage of the power supply 200. Wherein, the intermediate voltage VR2 is proportional to the output voltage VOUT, and the first reference voltage is proportional to the upper limit of the work voltage.

The second voltage detecting module 70 compares the intermediate voltage VR2 with a second reference voltage, to determine whether the intermediate voltage VR2 is less than the second reference voltage, to further determine whether the output voltage VOUT is less than the lower limit of the work voltage of the power supply 200. Wherein, the second reference voltage is proportional to the lower limit of the work voltage.

The first indication module 40 indicates the output voltage VOUT, when it is greater than the upper limit or when it is less than the lower limit of the work voltage. When the output voltage VOUT is greater than the upper limit of the work voltage, the first driving module 60 drives the first indication module 40 to indicate the output voltage VOUT. When the output voltage VOUT is less than the lower limit of the work voltage, the second driving module 50 drives the first indication module 40 to indicate the output voltage VOUT.

The second indication module 30 indicates the output voltage VOUT, when it is greater than the lower limit but less than the upper limit of the work voltage. When the output voltage VOUT is less than or equal to the upper limit of the work voltage and greater than or equal to the lower limit of the work voltage, the first driving module 60 and the second driving module 50 drive the second indication module 30 to indicate the output voltage VOUT. In other words, the upper and lower limits define a range. When the output voltage VOUT is outside the range the first indication module 40 indicates the output voltage VOUT is outside the range, and when the output voltage VOUT is in the range the second indication module 30 indicates the output voltage VOUT is within the range.

Figure 2:
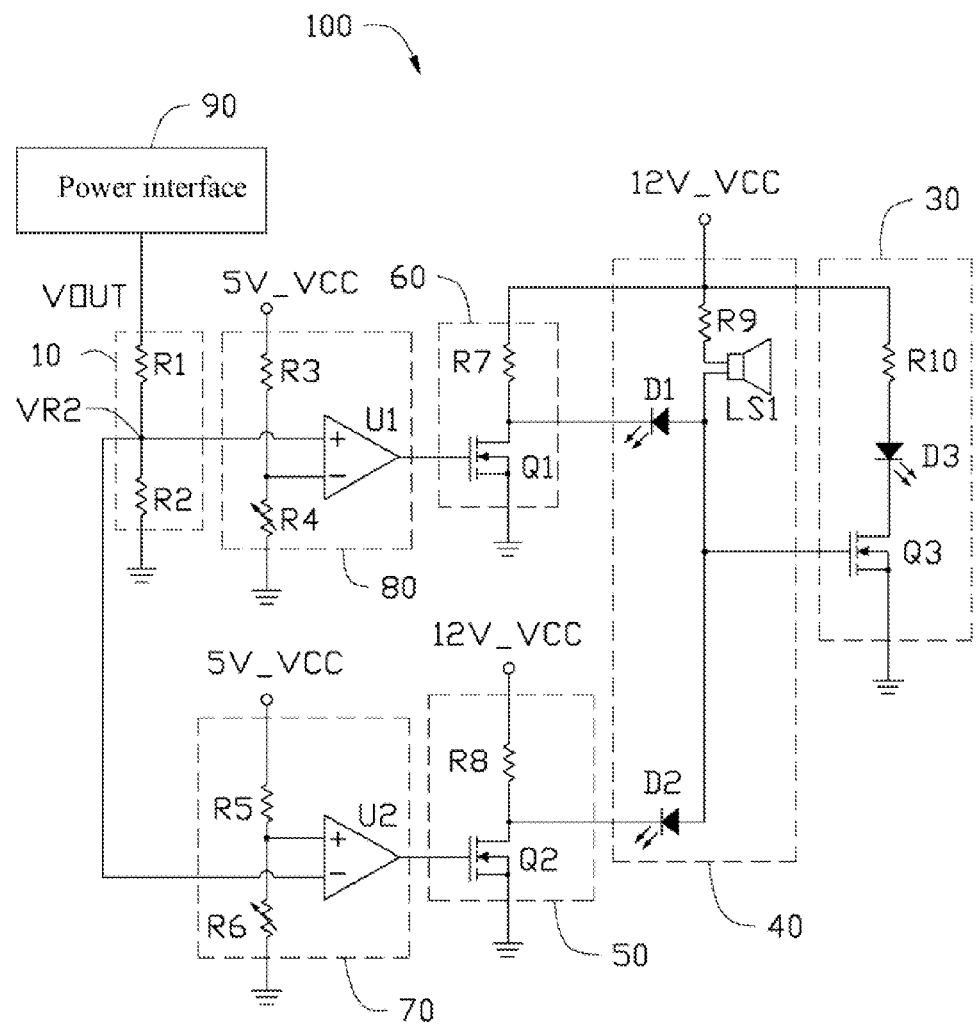
FIG. 2 is a circuit diagram of the voltage measurement apparatus of FIG. 1.

Referring to FIG. 2, the voltage converting module 10 includes resistors R1 and R2. An end of the resistor R1 is connected to the power interface 90, and another end of the resistor R1 is grounded through the resistor R2.

The first voltage detecting module 80 includes a comparator U1, a resistor R3, and a variable resistor R4. A positive input terminal of the comparator U1 is connected to a node between the resistors R1 and R2. A negative input terminal of the comparator U1 is connected to a power source 5V_VCC through the resistor R3 and also grounded through the variable resistor R4.

The second voltage detecting module 70 includes a comparator U2, a resistor R5, and a variable resistor R6. A positive input terminal of the comparator U2 is connected to the power source 5V_VCC through the resistor R5 and also grounded through the variable resistor R6. A negative input terminal of the comparator U2 is connected to the node between the resistors R1 and R2.

The first driving module 60 includes a resistor R7 and a field effect transistor (FET) Q1. A gate of the FET Q1 is connected to an output terminal of the comparator U1. A drain of the FET Q1 is connected to a power source 12V_VCC through the resistor R7. A source of the FET Q1 is grounded.

The second driving module 50 includes a resistor R8 and a FET Q2. A gate of the FET Q2 is connected to an output terminal of the comparator U2. A drain of the FET Q1 is connected to the power source 12V_VCC through the resistor R8. A source of the FET Q1 is grounded.

The first indication module 40 includes a resistor R9, a buzzer LS1, and two light emitting diodes (LEDs) D1 and D2. A first end of the buzzer LS1 is connected to the power source 12V_VCC through the resistor R9. A second end of the buzzer LS1 is connected to anodes of the LED D1 and D2. A cathode of the LED D1 is connected to the drain of the FET Q1. A cathode of the LED D2 is connected to the drain of the FET Q2.

The second indication module 30 includes a resistor R10, an LED D3, and a FET Q3. A gate of the FET Q3 is connected to the anodes of the LED D1 and D2. A drain of the FET Q3 is connected to a cathode of the LED D3. A source of the FET Q3 is grounded. An anode of the LED D3 is connected to the power source 12V_VCC through the resistor R10.

In one embodiment, the LEDs D1-D3 are different color LEDs, such as red, green, and yellow, to indicate different values of the output voltage VOUT.

For example, when the resistances of the resistors R1 and R2 are 2 ohms, the upper limit of the work voltage is +5.25 volts (V), and the lower limit of the work voltage is +4.75V. Accordingly, the intermediate voltage VR2 is calculated as follows: VR2=VOUT*R2/(R1+R2). Therefore, the first reference voltage at the negative input terminal of the comparator U1 can be adjusted to 2.625V through adjusting the variable resistor R4 according to the upper limit of the work voltage. The second reference voltage at the positive input terminal of the comparator U2 can be adjusted to 2.375V through adjusting the variable resistor R6 according to the lower limit of the work voltage.

If the intermediate voltage VR2 is less than or equal to the first reference voltage, which is 2.625V, the output voltage VOUT is less than or equal to the upper limit of the work voltage. If the intermediate voltage VR2 is greater than or equal to the second reference voltage, which is 2.375V, the output voltage VOUT is greater than or equal to the lower limit of the work voltage.

If the output voltage VOUT from the power supply 200 is greater than 5.25V, such as 6V, the intermediate voltage VR2 at the positive input terminal of the comparator U1 is 0.5*6V=3V. The first reference voltage at the negative input terminal of the comparator U1 is 2.625V. Because the intermediate voltage VR2 at the positive input terminal of the comparator U1 is greater than the first reference voltage at the negative input terminal of the comparator U1, the output terminal of the comparator U1 outputs a high level signal. The FET Q1 is turned on. The LED D1 is lit. The buzzer LS1 buzzes. At the same time, the intermediate voltage VR2 at the negative input terminal of the comparator U2 is also 3V. The second reference voltage at the positive input terminal of the comparator U2 is 2.375V. Because the intermediate voltage VR2 at the negative input terminal of the comparator U2 is greater than the second reference voltage at the positive input terminal of the comparator U2, the output terminal of the comparator U2 outputs a low level signal. The FET Q2 is turned off. The LED D2 is not lit. The FET Q3 receives a low level signal and is turned off. The LED D3 is not lit. Therefore, when the LED D1 is lit, the buzzer LS1 buzzes, and the LEDs D2 and D3 are not lit, the output voltage VOUT is greater than the upper limit of the work voltage.

If the output voltage VOUT from the power supply 200 is less than the 4.75V, such as 4V, the intermediate voltage VR2 at the positive input terminal of the comparator U1 is 0.5*4V=2V. The first reference voltage at the negative input terminal of the comparator U1 is 2.625V. Because the intermediate voltage VR2 at the positive input terminal of the comparator U1 is less than the first reference voltage at the negative input terminal of the comparator U1, the output terminal of the comparator U1 outputs a low level signal. The FET Q1 is turned off. The LED D1 is not lit. At the same time, the intermediate voltage VR2 at the negative input terminal of the comparator U2 is also 2V. The second reference voltage at the positive input terminal of the comparator U2 is 2.375V. Because the intermediate voltage VR2 at the negative input terminal of the comparator U2 is less than the second reference voltage at the positive input terminal of the comparator U2, the output terminal of the comparator U2 outputs a high level signal. The FET Q2 is turned on. The LED D2 is lit. The buzzer LS1 buzzes. At the same time, the FET Q3 receives a low level signal and is turned off. The LED D3 is not lit. Therefore, when the LED D2 is lit, the buzzer LS1 buzzes, and the LEDs D1 and D3 are not lit, the output voltage VOUT from the power supply 200 is less than the lower limit of the work voltage.

If the output voltage VOUT is between 4.75V and 5.25V, such as 5V, the intermediate voltage VR2 at the positive input terminal of the comparator U1 is 0.5*5V=2.5V. The first reference voltage at the negative input terminal of the comparator U1 is 2.625V. The second reference voltage at the positive input terminal of the comparator U2 is 2.375V. Because the intermediate voltage VR2 at the positive input terminal of the comparator U1 is less than the first reference voltage at the negative input terminal of the comparator U1, and the intermediate voltage VR2 at the negative input terminal of the comparator U2 is greater than the second reference voltage at the positive input terminal of the comparator U2, the output terminals of the comparators U1 and U2 output low level signals. The FETs Q1 and Q2 are turned off. The LEDs D1 and D2 are not lit. The gate of the FET Q3 receives a high level signal and is turned on. The LED D3 is lit. Therefore, when the LED D3 is lit, the LEDs D1 and D2 are not lit, and the buzzer LS1 does not buzz, the output voltage VOUT from the power supply 200 can be output to the motherboard of the computer.

In other embodiments, the power source 5V_VCC can be replaced of other power sources, such as a 12V power source, thus, the first reference voltage can be adjusted to the upper limit of the work voltage through the variable resistor R4, and the second reference voltage can be adjusted to the lower limit of the work voltage through the variable resistor R6. Therefore, the voltage converting module 10 can be omitted to save cost.

The voltage measurement apparatus 100 can measure the output voltage VOUT from the power supply 200 through the first voltage detecting module 80 and the second voltage detecting module 70.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A voltage measurement apparatus for measuring an output voltage from a power supply, to determine whether the output voltage can be as a work voltage, the work voltage comprising an upper limit and a lower limit, wherein the upper limit is greater than the lower limit, the voltage measurement apparatus comprising:
   a power interface to be connected to the power supply;
   a first voltage detecting module to receive the output voltage from the power supply through the power interface and compare the output voltage with a first reference voltage proportional to the upper limit voltage, to determine whether the output voltage is greater than the first reference voltage, to further determine whether the output voltage is greater than the upper limit voltage;
   a second voltage detecting module to receive the output voltage and compare the output voltage with a second reference voltage proportional to the lower limit voltage, to determine whether the output voltage is less than the second reference voltage, to further determine whether the output voltage is less than the lower limit voltage;

a first indication module;
a first driving module to drive the first indication module to indicate the output voltage when the output voltage is greater than the upper limit voltage;
a second driving module to drive the first indication module to indicate the output voltage when the output voltage is less than the lower limit voltage; and
a second indication module to indicate the output voltage driven by the first and the second driving module when the output voltage is less than or equal to the upper limit voltage and greater than or equal to the lower limit voltage.

2. The voltage measurement apparatus of claim 1, further comprising a voltage converting module connected between the power interface and each of the first and the second voltage detecting modules, wherein the output voltage from the power supply converted by the voltage converting module to an intermediate voltage, the intermediate voltage is output to the first and the second voltage detecting modules, wherein the intermediate voltage is proportional to the output voltage, if the intermediate voltage is less than or equal to the first reference voltage, the output voltage is less than or equal to the upper limit of the work voltage, if the intermediate voltage is greater than or equal to the second reference voltage, the output voltage is greater than or equal to the lower limit of the work voltage.

3. The voltage measurement apparatus of claim 2, wherein the voltage converting module comprises a first resistor and a second resistor, a first end of the first resistor is connected to the power interface, a second end of the first resistor is grounded through the second resistor, the first and second voltage detecting modules are both connected to a node between the first and second resistors.

4. The voltage measurement apparatus of claim 3, wherein the first voltage detecting module comprises a first comparator, a third resistor, and a first variable resistor, a positive input terminal of the first comparator is connected to the node between the first and the second resistors, a negative input terminal of the first comparator is connected to a first power source through the third resistor and also grounded through the first variable resistor.

5. The voltage measurement apparatus of claim 4, wherein the first driving module comprises a fourth resistor and a first field effect transistor (FET), a gate of the first FET is connected to an output terminal of the first comparator, a drain of the first FET is connected to a second power source through the fourth resistor, a source of the first FET is grounded.

6. The voltage measurement apparatus of claim 5, wherein the second voltage detecting module comprises a second comparator, a fifth resistor, and a second variable resistor, a positive input terminal of the second comparator is connected to the first power source through the fifth resistor and also grounded through the second variable resistor, a negative input terminal of the second comparator is connected to the node between the first and the second resistors.

7. The voltage measurement apparatus of claim 6, wherein the second driving module comprises a sixth resistor and a second FET, a gate of the second FET is connected to an output terminal of the second comparator, a drain of the second FET is connected to the second power source through the sixth resistor, a source of the second FET is grounded.

8. The voltage measurement apparatus of claim 7, wherein the first indication module comprises a seventh resistor, a buzzer, a first light emitting diode (LED), and a second LED, a first end of the buzzer is connected to the second power source through the seventh resistor, a second end of the buzzer is connected to anodes of the first and the second LEDs, a cathode of the first LED is connected to the drain of the first FET, a cathode of the second LED is connected to the drain of the second FET.

9. The voltage measurement apparatus of claim 8, wherein the second indication module comprises an eighth resistor, a third LED, and a third FET, a gate of the third FET is connected to the anodes of the first and the second LEDs, a drain of the third FET is connected to a cathode of the third LED, a source of the third FET is grounded, an anode of the third LED is connected to the second power source through the eighth resistor.

* * * * *